United States Patent [19]
Durand et al.

[11] Patent Number: 5,326,636
[45] Date of Patent: Jul. 5, 1994

[54] ASSEMBLY USING ELECTRICALLY CONDUCTIVE CEMENT

[75] Inventors: David Durand, Providence; David P. Vieau, East Greenwich; Ang-Ling Chu, Cranston; Tai S. Wei, Warwick, all of R.I.

[73] Assignee: Poly-Flex Circuits, Inc., Cranston, R.I.

[21] Appl. No.: 953,609

[22] Filed: Sep. 29, 1992

Related U.S. Application Data

[62] Division of Ser. No. 436,199, Nov. 14, 1989, Pat. No. 5,180,523.

[51] Int. Cl.$^5$ .............................................. B32B 9/00
[52] U.S. Cl. .................................. 428/323; 428/209; 428/901
[58] Field of Search ........................ 428/209, 323, 901

[56] References Cited

U.S. PATENT DOCUMENTS

| | | | |
|---|---|---|---|
| 3,140,342 | 7/1964 | Ehrreich et al. | 174/35 |
| 3,663,241 | 5/1972 | Short | 106/1 |
| 3,750,243 | 8/1973 | Prentice | 427/125 |
| 3,762,946 | 10/1973 | Stow et al. | 117/227 |
| 3,968,056 | 7/1976 | Bolon et al. | 252/514 |
| 4,088,801 | 5/1978 | Bolon et al. | 427/125 |
| 4,113,981 | 9/1978 | Fujita et al. | 174/88 R |
| 4,210,704 | 7/1980 | Chandross et al. | 252/514 |
| 4,243,474 | 1/1981 | Shirai et al. | 156/630 |
| 4,410,457 | 10/1983 | Fujimura et al. | 252/508 |
| 4,487,811 | 12/1984 | Eichelberger et al. | 428/546 |
| 4,564,563 | 1/1986 | Martin et al. | 428/546 |
| 4,566,990 | 1/1986 | Liu et al. | 252/503 |
| 4,568,592 | 4/1986 | Kawaguchi et al. | 428/107 |
| 4,595,606 | 6/1986 | St. John et al. | 427/96 |

(List continued on next page.)

FOREIGN PATENT DOCUMENTS

| | | | |
|---|---|---|---|
| 2938465A1 | 4/1981 | Fed. Rep. of Germany | H05K 1/09 |
| 3217723A1 | 12/1982 | Fed. Rep. of Germany | C09J 3/16 |
| 53-29358 | 3/1978 | Japan | C08L 77/00 |
| 53-147732 | 12/1978 | Japan | C09J 5/06 |
| 57-23963 | 5/1982 | Japan | H01B 1/22 |
| 59-132503 | 7/1984 | Japan | H01B 1/22 |
| 61-51705 | 3/1986 | Japan | H01B 5/16 |
| 62-061336 | 3/1987 | Japan | H01L 21/58 |
| 63-162758 | 7/1988 | Japan | C08L 75/04 |
| 2089126A | 12/1981 | United Kingdom | H01L 23/14 |
| 2103250A | 2/1983 | United Kingdom | B22F 7/00 |
| 2163168A | 2/1986 | United Kingdom | C08L 75/06 |

*Primary Examiner*—Patrick J. Ryan
*Assistant Examiner*—Kam F. Lee
*Attorney, Agent, or Firm*—Cushman, Darby & Cushman

[57] ABSTRACT

An electrically conductive cement having substantially stable conductivity and resistance characteristics under high humidity conditions comprises a mixture of two epoxy resins with the proportion of each epoxy resin adjusted to provide a volumetric shrinkage in the mixture in the 4 to 16% and a conductive silver particular filler including agglomerates having size and surface characteristics that maintain stable electrical contact with an electrical component lead. The epoxy mixture is preferably a combination of a high-shrinkage epoxy resin and a lower-shrinkage epoxy resin in the appropriate amounts of each so as to produce the desired volumetric shrinkage characteristic. The conductive particle filler is preferably an admixture of silver flakes, silver powder, and an effective amount of silver agglomerates. The agglomerates are irregularly shaped particles having multiple surface indentations and recesses to produce many rough-edged salients or ridges and having a particle length, width, and thickness aspect ratio of about 1:1:1. An effective amount of such agglomerates appears to effect penetration of surface oxides when establishing the cemented connection as a result of the volumetric shringage of the polymeric carrier upon curing.

2 Claims, 3 Drawing Sheets

U.S. PATENT DOCUMENTS

| | | | |
|---|---|---|---|
| 4,624,801 | 11/1986 | Kawaguchi et al. | 252/500 |
| 4,696,764 | 9/1987 | Yamazaki | 252/503 |
| 4,701,279 | 10/1987 | Kawaguchi et al. | 252/511 |
| 4,716,081 | 12/1987 | Ehrreich | 428/403 |
| 4,729,809 | 3/1988 | Dery et al. | 252/512 |
| 4,732,702 | 3/1988 | Yamazaki et al. | 252/512 |
| 4,747,968 | 5/1988 | Gilleo | 252/514 |
| 4,793,946 | 12/1988 | Hsu | 427/125 |
| 4,814,040 | 3/1989 | Ozawa | 156/634 |
| 4,836,955 | 6/1989 | Ehrreich | 252/512 |
| 4,859,268 | 8/1989 | Joseph et al. | 156/275.5 |
| 4,859,364 | 8/1989 | Yamamoto et al. | 252/512 |
| 4,880,570 | 11/1989 | Sanborn et al. | 252/512 |
| 4,975,221 | 12/1990 | Chen et al. | 156/330 |
| 4,976,813 | 12/1990 | Salensky et al. | 427/96 |
| 5,006,575 | 4/1991 | Chan | 252/514 |
| 5,045,141 | 9/1991 | Salensky et al. | 252/514 |
| 5,087,314 | 2/1992 | Sandborn et al. | 156/330 |

| | ROOM TEMP | INITIAL TEST COND | 15.5 HOURS | 24 HOURS | 39 HOURS | 63 HOURS | 64 HOURS | % INCR | 1000 HOURS EXTRAP | % INCR EXTRAP |
|---|---|---|---|---|---|---|---|---|---|---|
| 68 PIN SM DEVICE | 12.435 | 13.759 | 15.546 | 15.914 | 16.269 | 16.73 | 15.296 | 33.9 | 34.648 | 214 |
| 44 PIN SM DEVICE #1 | 7.367 | 8.127 | 10.116 | 10.214 | 10.324 | 10.40 | 9.442 | 47.5 | 13.407 | 99.5 |
| 44 PIN SM DEVICE #2 | 6.961 | 7.657 | 9.126 | 9.276 | 9.362 | 9.47 | 8.661 | 42.9 | 13.807 | 132.1 |
| RESISTOR STRING | 25.669 | 26.238 | 26.302 | 26.294 | 26.287 | 26.29 | 25.97 | 18.0 | 26.407 | 7.6 |

FIG. 1

|  | Room Temp | Initial Test Cond | 14.5 Hours | 86 Hours | % Incr | 117 Hours |
|---|---|---|---|---|---|---|
| Trial 1 | | | | | | |
| 68 Pin SM Device | 10.44 | 11.24 | 11.12 | 11.06 | -2.5 | 11.03 |
| Resistor String | 25.43 | 25.58 | 25.65 | 25.65 | 4.4 | 25.64 |
| 44 Pin SM Device | 5.95 | 6.4 | 6.35 | 6.32 | -2.4 | 6.31 |
| Trial 2 | | | | | | |
| 68 Pin SM Device | 9.03 | 9.78 | 9.72 | 9.68 | -1.7 | 9.67 |
| Resistor String | 2.53 | 25.51 | 25.55 | 25.5 | -0.7 | 25.54 |
| 44 Pin SM Device | 6.63 | 7.15 | 7.1 | 7.08 | -1.7 | 7.07 |
| Trial 3 | | | | | | |
| 68 Pin SM Device | 10.65 | 11.55 | 11.53 | 11.5 | -0.7 | 11.47 |
| Resistor String | 25.38 | 25.57 | 25.66 | 25.67 | 6.4 | 25.66 |
| 44 Pin SM Device | 7.04 | 7.62 | 7.61 | 7.58 | -0.97 | 7.57 |
| Trial 4 | | | | | | |
| 68 Pin SM Device | 9.72 | 10.87 | 10.53 | 10.51 | -0.81 | 10.5 |
| Resistor String | 25.13 | 25.31 | 25.39 | 25.39 | 6.1 | 25.39 |
| 44 Pin SM Device | 5.68 | 6.16 | 6.12 | 6.09 | -2.2 | 6.08 |
| Trial 5 | | | | | | |
| 68 Pin SM Device | 10.0 | 10.87 | 10.8 | 10.76 | -1.6 | 10.73 |
| Resistor String | 25.11 | 25.29 | 25.36 | 25.37 | 6.2 | 25.37 |
| 44 Pin SM Device | 6.29 | 6.81 | 6.79 | 6.77 | -1.0 | 6.75 |
| Trial 6 | | | | | | |
| 68 Pin SM Device | 10.23 | 11.04 | 10.98 | 10.95 | -1.3 | 10.91 |
| Resistor String | 25.18 | 25.37 | 25.39 | 25.39 | 1.5 | 25.39 |
| 44 Pin SM Device | 7.34 | 7.9 | 7.85 | 7.82 | -1.6 | 7.79 |

F I G. 3

ASSEMBLY USING ELECTRICALLY CONDUCTIVE CEMENT

This application is a division of application Ser. No. 07/436,199, filed on Nov. 14, 1989, now U.S. Pat. No. 5,180,523.

BACKGROUND OF THE INVENTION

The present invention relates to electrically conductive cements or adhesives and, more particularly, to electrically conductive cements or adhesives having superior long-term performance in high temperature and high humidity environments.

Electrically conductive cements and adhesives are typically fabricated from single- or multi-component non-conductive carrier materials and particulate metallic fillers. While various cements can be used as the carrier, multi-component epoxies and single-component solvent-based systems are preferred. Epoxies have a long shelf life, can be cured with relative ease, and form a strong and reliable bond with many materials. In a similar manner, single-component solvent-based systems can be readily cured by driving off the solvent to form a strong and reliable bond with many materials. The metallic fillers are typically noble metals, such as gold or silver, in various particulate sizes. The preferred metallic filler is typically a mixture of flake-like and non-flake particles of various sizes. The particles can be essentially solid or, in some cases, metal-plated non-conductive bodies. In a typical formulation, the conductive filler can comprise 75% by weight of the total material with the polymeric carrier comprising the remaining material. It has been thought that metal particles in the form of flakes or platelets provide the bulk conductivity characteristics because the flakes tend to align themselves in an overlapping relationship in the cured carrier to provide a conductive electron pathway. Non-flake conductive fillers in the carrier are thought to fill interstices between the flake-like particles in the carrier to provide enhanced conductivity between the flake- or platelet-like particles.

Most electric circuits are fabricated as traditional rigid printed circuit boards using the subtractive process in which copper traces and connection pads are etched from a copper foil layer attached to a rigid, non-conductive board. The solder-plated leads of the electrical components are passed through mounting holes in the board and connected to their connection pads by lead/tin soldering. It is also known to fabricate so-called flex circuits in which the copper traces and connection pads are formed on a flexible layer of a polyester material in the 2-3 mil thickness range, such as KAPTON TM mylar. The leads of the electronic components are passed through mounting holes in the flexible substrate and connected to their connection pads by lead/tin soldering in a manner analogous to the rigid circuit boards. Recently, surface-mount components (SMC) have been developed in which the component leads are merely mounted upon the conductive pads and soldered into place to form a butt joint; surface-mount technology being suitable for both rigid and flexible substrates. Traditional soldered-component systems represent proven and highly developed technologies with proven performance under various temperature/humidity conditions. However, traditional soldered-component systems require extensive chemical processing with various types of etchants and similar chemicals to fabricate the circuit substrate and various fluxes and solvents to effect the soldered connection. Additionally, soldering involves the application of heat to effect the soldered connection. While components and rigid substrates are designed to accommodate the heat of soldering, flexible circuits are more susceptible to distortion because of their relatively thin cross-section and low heat capacity. Thus, soldering components on a flexible substrate can cause local 'puckering' of the substrate, changes in the center-to-center dimensions of the various connection pads, and warpage of the entire circuit substrate.

Efforts have been made to use electrically conductive inks, cements, and adhesives to replace existing soldered-component systems in both rigid and flexible substrate applications in an effort to reduce costs and reduce the adverse effects of the chemicals and heat used in soldered-component systems. For example, electrically conductive inks have been printed on flexible polyester substrates and the conductive leads of the surface-mount components then cemented to their connection pads by electrically conductive single-component adhesives or multi-component epoxy resins. The resulting printed circuit can be readily configured to fit into a particular mounting envelope in a manner that cannot be achieved with rigid printed circuit boards. It is estimated that a successful system utilizing conductive inks and epoxies will provide significant cost savings relative to traditional soldered-component systems.

While electrically conductive cements do not possess the conductivity of solid metals and solder alloys, their conductivity (for example, 0.1-2 $\Omega$ per connection) is adequate for many electrical circuits. For example, a junction resistance of one ohm or so will have little effect where the circuit component is a resistor or other circuit device having a resistance or impedance of several hundred or thousands of ohms or greater. While junction resistance becomes more important in low impedance circuit applications, the circuit can oftentimes be designed to accommodate cumulative junction resistances.

One factor that affects the electrical conductivity of the conductive cement that defines the junction is the presence or absence of non-conductive or resistive surface oxides that form as a consequence of exposure to ambient air and moisture. In soldered-component systems, this oxide is largely removed by the heat of the molten solder and the use of various types of fluxes that shield the junction from the ambient atmosphere and moisture as the solder cools. In conductive cement systems, in which heat and fluxes are not present during the curing process, it is preferable that any cement or adhesive have a mechanism that can overcome surface oxide without the need to clean the leaded electrical components with aggressive cleaning agents prior to effecting the connection.

While existing conductive cements and adhesives provide adequate performance for most applications, all such cements and adhesives are susceptible to changes in their resistivity $\rho$ with continued exposure to humidity and are particularly sensitive to continued exposure to the combination of higher humidities and higher temperatures. Since the cements use a single- or double-component polymeric binder as the curable adhesive medium, they are all permeable, to some extent or the other, to moisture. While a circuit can be designed to accommodate cumulative junction resistances, any change in that resistance with time will probably have a detrimental affect on overall electrical performance. It is believed that moisture permeates the polymeric binders with time to effect oxidation at the connection interface between the connection pad and the component lead, which oxidation tends to increase resistance and diminish the probability of maintaining a gas-tight seal. Where silver is used as the conductive filler, the presence of moisture also accelerates the development of silver ions, and, under the certain circumstances, can foster undesired migration.

In general, silver-filled polymeric systems perform well over a reasonably large temperature range but not at high humidity. When aged under high humidity conditions, the resistance of the junction oftentimes increases significantly. While many circuits can operate adequately with increases in the resistively of one or more of their connections, the humidity sensitivity is considered a factor limiting more widespread use of conductive polymeric cements and adhesives in rigid and flexible substrate applications.

As a representative example of the change in junction resistance under 90% relative humidity conditions, a conductive adhesive manufactured by Emerson & Cuming of Lexington, MA 02173 and sold under the AMICON TM CSM-933-65-1 designation was used to connect a 68-pin surface-mount device (SMD), two 44-pin surface-mount devices, and a ten-resistor series string in a test circuit and subjected to a 140° C. cure for a period of 10 minutes in accordance with the manufacturer's instructions. The pins of the various surface-mount devices were series-connected through resistive elements within the surface-mount devices and the total junction resistance determined by subtracting the cumulative series resistance of the intra-device elements from the total measured resistance. In a similar manner, the resistance measurement for the resistor-string was effected by subtracting the cumulative values of the resistors that comprised the string from the total series resistance to arrive at a junction resistance value. The resistance of the intra-device elements of the surface-mount devices as well as the resistors within the resistor string was stable within the temperature and humidity range of the tests as verified by control circuits. The initial junction resistance in ohms was measured at room temperature and at test conditions of 60° C. and 90% relative humidity as shown in the left two column of FIG. 1. The resistivity was then again measured after 15.5, 24, 39, 63, and 64 hours exposure at the 60° C. and 90% relative humidity test conditions. As shown in FIG. 1, the ohmic resistance of all junctions increased with time at 90% relative humidity with an extrapolated value for 1000- hours indicating a substantial increase for the 68-pin devices and the two 44-pin devices and less of an increase for the resistor-string.

As can be appreciated from a consideration of the data in FIG. 1, a known conducive adhesive undergoes a substantial increment in junction resistance at elevated relative humidity with time, this increase sufficient to mitigate against the use of the material in many circuit applications.

SUMMARY OF THE INVENTION

In view of the above, it is an object of the present invention, among others, to provide an electrically conductive cement or adhesive having improved performance characteristics, particularly under high humidity and/or temperature conditions.

It is another object of the present invention to provide an electrically conductive cement in which the volumetric shrinkage rate of the polymeric carrier contributes to the formation of the electrical connection.

It is still another object of the present invention to provide an electrically conductive cement having conductive agglomerates having surface characteristics and a size to assist in establishing gas-tight surface contact with the surfaces to be connected in response to the volumetric shrinkage of the polymeric carrier.

In view of these objects, and others, the present invention provides an electrically conductive cement having a curable polymeric carrier having a volumetric shrinkage between the as applied uncured state and the cured state of between 4% and 16% and which carries a large percentage by volume of conductive metal particle agglomerates having substantial surface irregularities. It has been found that the use of a carrier or binder having a volumetric shrinkage characteristic between the uncured and cured states of between 4% and 16% appears to effect a measure of compaction of the conductive metal agglomerates to both cause the agglomerates to be forced into enhanced electrical contact with the surfaces to be connected and to provide a measure of compaction between the agglomerates and other types of particles to enhance particle-to-particle conduction. It is believed that the shrinkage of the polymeric carrier during curing places the interior particles under a compressive force sufficient to force the particles into engagement with one another as well as cause the rough-surfaced agglomerates to penetrate contaminants and non-conductive oxides that may be present on the lead to be connected to the connection pad of the substrate. The polymeric carrier is preferably constituted from a mixture of two carriers, one having a high volumetric shrinkage characteristic and the other having a low volumetric shrinkage characteristic, with the weight percentage of the two components in the mixture being varied so as to provide a volumetric shrinkage characteristic of the mixture in the effective range. A volumetric shrinkage characteristic below the effective range lower-limit results in a less than acceptable increase in junction resistance in response to long-term exposure to high humidity conditions, while a volumetric shrinkage characteristic larger than the effective range upper-limit results in undue mechanical stress at the connection, in a shifting of the electrical component during curing, and, in the context of flexible substrates, local buckling or warping of the substrate immediately adjacent the connection. Additionally, adhesives and cements having a shrinkage characteristic above the effective range upper-limit also tend to have poor handling characteristics in screen printing contexts.

It is believed that the volumetric shrinkage of the cement having an effective concentration of rough shaped agglomerates leads to superior stability of the junction resistance, especially under high-humidity circumstances, by internally compacting the conductive particles. The concept of internal compacting has analogies in the conductive gasket art, as presented in U.S. Pat. No. 3,140,342 to Ehrreich et al., in which metal particles are held in electrical contact in a resilient plastic matrix. The metal particles can have a shape such a platelet, acicular, rhomboid, or spheroidal, and can have an average particle size of 100 mils to 0.05 mil. The particles are preferably maintained in a plastic matrix that shrinks during the curing step to the place the plastic under tension to maintain particle-to-particle contact.

The conductive particles of the present invention are, preferably, agglomerates in a 10.6μ to 2.00μ distribution range (with a mean size of 4.5μ) and rough external appearance characterized by numerous recesses and ridge-like boundaries or salients and having a length, width, and depth aspect ratio of approximate 1:1:1. The surface roughness characteristic of such agglomerates contributes to the penetration of surface oxides or contaminants at the surface of a component lead when the cement undergoes volumetric contraction during curing. Since the agglomerates have a 1:1:1 aspect ratio, they do not yield, deform, or bend as is believed to be the case with flake-like particles. Agglomerates are preferred as the electron carriers since the external surface characteristics assist in forming gas-tight connections between particles, the conductive leads of the electrical component, and the connection pad of the substrate.

The use of flake-like particles and fine conductive powders in combination with the aforementioned agglomerates is also desirable since the flake-like particles provide bulk conduction characteristics and the powders are believed to assist in filling the interstices between the other conductive particles in the formulation of the present invention.

In the preferred embodiment, a conductive cement in accordance with the present invention comprises a mixture of two epoxy resins with the proportion of each epoxy resin adjusted to provide a volumetric shrinkage in the mixture in the 4 to 16% range with 6-14% being considered optimum for long-term resistance stability under high humidity conditions. Volumetric shrinkage characteristics in the 2.2-2.3% range provide decreased electrical performance while volumetric shrinkage characteristics above 16% can induce stress in the connection. The epoxy mixture is preferably a combination of a high-shrinkage epoxy resin and a lower-shrinkage epoxy resin in the appropriate amounts of each so as to produce the above-described desired volumetric shrinkage characteristic.

If desired, a wetting agent (typically less than 2-5%) may be provided in an amount effective to enhance the wetting ability of the uncured epoxy resin mixture during its application.

The conductive particle filler is preferably an admixture of silver flakes, silver powder, and an effective amount of silver agglomerates. The latter are irregularly shaped particles having multiple surface indentations and recesses to produce many rough-edged salients or ridges and have a particle length, width, and thickness aspect ratio of about 1:1:1. Silver is preferred because its oxides are conductive in contrast to the insulating oxides of copper, nickel, tin, etc. An effective amount of such agglomerates appears to effect penetration of surface oxides when establishing the cemented connection. In general, about 75 weight percent of the epoxy resin mixture/conductive filler particle combination is conductive metal particles.

The present invention advantageously provides an electrically conductive cement having substantially stable conductivity and resistance characteristics under high humidity conditions and is believed to achieve this result as a consequence of providing a cement having a volumetric shrinkage characteristic in a range that assures particle-to-particle contact and particle-to-connection surface contact thereby producing a reliable connection.

Other objects and further scope of applicability of the present invention will become apparent from the detailed description to follow, taken in conjunction with the accompanying drawings, in which like parts are designated by like reference characters.

BRIEF DESCRIPTION OF THE DRAWING

FIG. 1 is a table demonstrating the undesired increase in junction resistance with exposure to 90% relative humidity conditions of a prior art formulation;

FIG. 3 is a table demonstrating the desired stability of the junction resistance on exposure to 90% relative humidity conditions of a formulation in accordance with Example I of the present invention.

DESCRIPTION OF A PREFERRED EMBODIMENT

Figure 2:
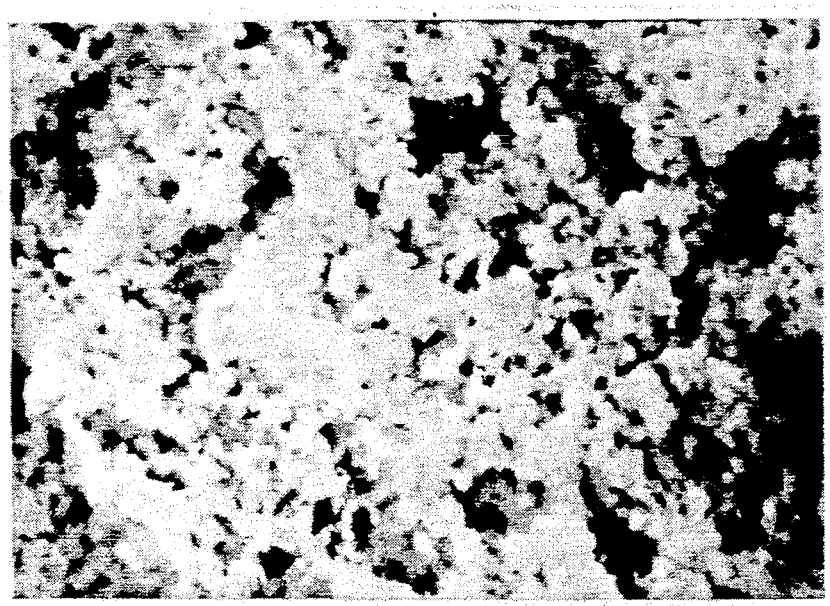
FIG. 2 is a photomicrograph of silver agglomerates at 5000X and illustrating the many rough surface features.

A number of factors must be considered in developing a conductive cement having improved performance characteristics under adverse characteristics, particularly high humidity and temperature conditions. Since all polymeric carriers, to some extent or the other, are moisture permeable, the conductive particle filler must be such that formation of non-conductive oxidation products is minimal with continued exposure to humidity and should have surface characteristics that enhance particle-to-particle contact; to this end a silver metal particle filler is preferred, although other noble metals are suitable. The conductive particle filler comprises an effective amount of rough-shaped silver agglomerates having a selected size range, flake-like or platelet-like silver particles, and finely powdered silver particles.

The silver agglomerates are characterized by an irregular body-shape and a surface with many recesses that define projecting salients or ridges at the boundaries between the recesses. These agglomerates are preferably characterized as having a length, width, and thickness aspect ratio of approximately 1:1:1 and, as a consequence, appear to function as force vectors which can pierce the oxides present at a connection interface and maintain stable electrical contact even when subjected to elevated temperatures and humidities. The silver agglomerates are believed to form the primary electron conduction path in the cured cement by direct surface-to-surface inter-particle contact and assist in contacting and penetrating the surface of the electrical lead to be connected.

The addition of smaller sized silver particles in the cured cement assists in providing interstitial conduction paths between the larger-sized particles.

While agglomerates in the preferred size and effective concentration are desired and believed to provide the enhanced stability in the conduction characteristic under high humidity conditions, flake-like or platelet-like conductive particles and fine silver powders can also be employed in combination with the silver agglomerates.

Flake-like particles are defined as particulates having a thickness dimension which is substantially (i.e., an order or magnitude) smaller than its length and width. It is believed that the platelets or flake-like metal particles do not possess the aggressive surface characteristics of agglomerates to effect long-term contact under all conditions, especially high-humidity conditions. It is believed that flake-like particles will yield or deform when the polymeric carrier undergoes volumetric shrinkage during curing in contrast to the agglomerates which are believed to have sufficient structural rigidity to effect forceful contact with one another and the surfaces to be connected. The flake-like particles tend to preferentially overlap or overlay one another in an aligned relationship and are thus believed to provide an additional electron conduction path. The flake-like particles enhance the bulk conductivity of the material but tend to deflect or yield at the surface interfaces of the lead or connection pad under the internal forces caused by the volumetric shrinkage. Thus, these flake-like particles appear not to provide the stable contact through the tin oxides of the solder-plated lead at higher temperatures and humidity.

The polymeric carrier ideally possesses a volumetric shrinkage characteristic in the 4–16% percent range in order to assure internal compaction of the conductive particle filler and, particularly, the agglomerates. Additional characteristics of the polymeric carrier include good adhesion, wettability, and good handling characteristics. Since many conductive cements are applied by screen-printing techniques, the resultant uncured polymeric carrier should have a viscosity which is convenient for application by such screen processes.

EXAMPLE I

A conductive cement is prepared using a conductive particle filler of three types of silver particulates A, B, and C. Particulate A is a silver flake having a Fisher sub-sieve size (FSSS) in the range of 0.90–1.30 microns, a tap density (by tap-pak) of 3.0 to 3.5 g/cc, a Scott apparent density of 30–35 g/in$^3$, and a surface area of 0.3–0.6m$^2$/g with a Leeds and Northrop Microtrac size distribution of 90%<14.00$\mu$, 50%<7.00$\mu$, and 10%<2.00$\mu$. A suitable particulate A is "Silver Flake #53" available from the Electronic Materials Division of the Metz Metallurgical Corporation, 3900 South Clinton Ave., South Plainfield, NJ 07080.

Particulate B is silver agglomerate having a Fisher sub-sieve size (FSSS) of 0.6 microns, a tap density (by tap-pak) of 1.85 g/cc, a Scott apparent density of 16.7 g/in$^3$, and a surface area of 1.62m$^2$/g with a Leeds and Northrop Microtrac size distribution of 100% <10.6$\mu$, 90% <8.10$\mu$, 50% <4.4$\mu$, and 10% <2.00$\mu$ with a mean size of 4.5$\mu$.

A suitable particulate B is "Silver Powder SPS-100" available from the Electronic Materials Division of the Metz Metallurgical Corporation, and, as shown in the photomicrograph of FIG. 2, has many rough surface features.

Particulate C is silver powder having a Fisher sub-sieve size (FSSS) of 0.75 microns, a tap density (by tap-pak) of 2.70 g/cc, a Scott apparent density of 20.1 g/in$^3$, and a surface area of 1.41m$^2$/g with a Leeds and Northrop Microtrac size distribution of 100% <5.27$\mu$, 90% <3.16$\mu$, 50% <1.25$\mu$, and 10% <0.51$\mu$ with a mean size of 1.61$\mu$.

A suitable particulate C is "Fine Silver Powder S-ED" available from the Electronic Materials Division of the Metz Metallurgical Corporation.

Particulates A, B, and C are desirably mixed in a weight ratio of 40%, 30%, and 30% to constitute the metallic silver filler that is admixed with the epoxy resin mixture.

The polymeric carrier comprises principally a mixture of two epoxy resins, epoxy A and epoxy B, which provides the effective volumetric shrinkage characteristic as described above. Epoxy A is a bisphenol F epoxy resin such as "Aratronic TM 5046", a bisphenol F diglycidyl ether available from the Ciba-Geigy Corporation and having a relatively low viscosity of 1400 cps at 25° C.. Epoxy B is a liquid phenol epoxy novolac resin, such as "Quatrex TM 2010", a phenol epoxy novolac resin available from Quatrex Electronic Resins and having a relatively high viscosity of 25,000–45,000 cks at 52° C..

The polymeric carrier can also include a conventional hardener such a cyanoethyl imidazole, for instance, N-(2-cyanoethyl)-2-ethy1,4-methylimidazole) available from PolyOrganix Corporation of Newburyport, MA 01950 under the CURIMID TM -CN designation.

The polymeric carrier can additionally include a coupling or wetting agent to provide enhanced wetting of the uncured material. A representative coupling agent is gamma-glycidoxypropyltrimethoxysilane available from the Union Carbide Company under the "A-187" designation. Yet another adjutant includable in the polymeric carrier of the present invention is Gamma butyrolactone, available under the tradename ALDRICH TM which functions as a dilutent to adjust physical handling capabilities.

An electrically conductive cement composition in accordance with the present invention was prepared and has the following formulation:

| Component | Batch Quantity (normalized (weight units) | % weight |
|---|---|---|
| Epoxy A | 8.275 | |
| Epoxy B | 8.275 | |
| Hardener | 3.973 | |
| Dilutent | 1.985 | |
| Coupling Agt | .0.993 | |
| | | total epoxy wt = 23.5% |
| Particle A | 30.600 | |
| Particle B | 22.950 | |
| Particle C | 22.950 | |
| | | total silver wt = 76.5% |

The 76.5% silver content represents a preferred value for practical applications such as application by stencil, screen print, tamp, syringe, etc. Below 74% the material can exhibit electrical instability with resistance increasing by an order of magnitude in the 90% relative humidity test. Above 78% the conductive cement composition is too viscous for practical use in stencil and screen printing applications.

The above formulation was determined to have a volumetric shrinkage characteristic of 6% and was used to connect a 68-pin surface-mount device (SMD), a 44-pin surface-mount device, and a series-connected resistor string in each of six test circuits (Trials 1–6) and subjected to a 140° C. cure for a period of 10 minutes. The pins of the various surface-mount devices were series-connected through resistive elements within the surface-mount devices and the total junction resistance was determined by subtracting the cumulative series resistance of the intra-device elements from the total measured resistance. In a similar manner, the resistance measurement for the resistor-string was effected by subtracting the cumulative values of the resistors that comprised the string from the total series resistance to arrive at an ohmic junction resistance value. The resistance of the intra-device elements of the surface-mount devices, as well as the resistors within the resistor string, was stable within the temperature and humidity range of the tests as verified by control circuits. The junction resistance was measured at room temperature and at test conditions of 60° C. and 90% relative humidity as shown in the left two columns of FIG. 3. The resistivity was then again measured after 14.5, 86, and 117 hours exposure at the 60° C. and 90% relative humidity test conditions. As shown by the % increment column in FIG. 3, the ohmic resistance of all junctions varied minimally after 86 hours at 90% relative humidity and demonstrated continued stability at 117 hours.

The present invention advantageously provides an electrically conductive cement composition having substantially stable conductivity and resistance characteristics under high humidity conditions and is believed to achieve this result as a consequence of providing a cement having a volumetric shrinkage rate in a range that assures particle-to-particle contact and particle-to-connection surface contact to produce a reliable connection.

As will be apparent to those skilled in the art, various changes and modifications may be made to the illustrated electrically conductive cement of the present invention without departing from the spirit and scope of the invention as determined in the appended claims and their legal equivalent.

What is claimed is:

1. An assembly comprising a substrate having a circuit printed thereon and at least one electrical component electrically connected to said circuit with an electrically conductive cement, the electrically conductive cement comprising a polymeric carrier having a volumetric shrinkage characteristic of about 4 to about 16%; and a filler comprising about 60 to about 90% by weight of the cement including conductive particles consisting of:
   i) agglomerate particles having a mean particle size of about 4.5 microns, an aspect ratio of about 1:1:1 and a rough external appearance characterized by sufficient recesses and ridge-like boundaries so as to effect enhanced electrical contact between surfaces adhered with the cement,
   ii) a mixture of flake particles having a FSSS of about 0.90 to about 1.30 microns and a surface area of about 0.3 to 0.6 $m^2/g$ and a particle size distribution of about 90%<14 microns, 50%<7 microns, and 10%<2 microns, and
   iii) powder particles having a mean particle size of about 1.6 microns.

2. The assembly of claim 1 wherein the substrate is flexible.

* * * * *